United States Patent [19]
Bright

[11] 4,099,262
[45] Jul. 4, 1978

[54] AUTOMATIC MEMORY CONTROL FEEDBACK SYSTEM FOR A CYCLING OPTICAL IMAGING SYSTEM

[75] Inventor: Clark I. Bright, Kula, Hi.

[73] Assignee: Xerox Corporation, Stamford, Conn.

[21] Appl. No.: 762,073

[22] Filed: Jan. 24, 1977

[51] Int. Cl.² ............................................. G11C 11/46
[52] U.S. Cl. ..................................... 365/126; 346/151
[58] Field of Search ......................... 340/173 TP, 151

[56] References Cited

U.S. PATENT DOCUMENTS

| | | | |
|---|---|---|---|
| 3,636,526 | 1/1972 | Feinleib | 340/173 TP |
| 3,949,160 | 4/1976 | Heurtley | 340/173 TP |

*Primary Examiner*—Stuart N. Hecker
*Attorney, Agent, or Firm*—James J. Ralabate; Franklyn C. Weiss; Irving Keschner

[57] ABSTRACT

A system for altering the deformation of a cyclic imaging member is disclosed. After a surface of the cyclic imaging member has been deformed at the beginning of a cycle, the system alters the deformation of the surface in response to a measurement of the extent of deformation of the surface.

32 Claims, 4 Drawing Figures

AUTOMATIC MEMORY CONTROL FEEDBACK SYSTEM FOR A CYCLING OPTICAL IMAGING SYSTEM

BACKGROUND OF THE INVENTION

This invention relates to an optical system utilizing a cyclic optical imaging member. One such cyclic optical imaging member, sometimes referred to as a "ruticon", is a laminated device, characterized by elastomer and photoconductive layers. In most such cyclic imaging members, the elastomer and photo-conductive layers are sandwiched between two electrically conductive layers across which an electric field is maintained. Cyclic optical imaging members of the type described are explained in greater detail in U.S. Pat. No. 3,716,359 issued to Nicholas K. Sheridan on Feb. 13, 1973, and assigned to the same assignee.

Cyclic optical imaging members are primarily used to transfer information from an optical source to a recording or a display device. In operation, a surface of the imaging member deforms in response to light which is incident upon one of the surfaces of the imaging member. This deformation is accomplished as follows: When the photoconductor is exposed to an optical pattern, the electric field maintained across the photoconductor induces a flow of charge in those regions of the photoconductor which are exposed to the light. The flow of charge varies the electric field, creating a mechanical force which causes the elastomer to deform. The equilibrium point of the deformation occurs when the mechanical force of the electric field is balanced by the surface tension and the elastic forces of the elastomer.

Deformation may be temporary or permanent depending upon the elastic modulus of the elastomer and the magnitude of the electric field across the elastomer. For instance, permanent deformation may occur when the degree of deformation exceeds the elastic limits of the elastomer. Also, at least two types of temporary surface deformation can be observed. First, when a large electric field and a very complient elastomer are used, the elastomer will remain deformed as long as the electric field is maintained in spite of any subsequent illumination of the photoconductor. The deformation can be erased only by removing or reversing the electric field across the elastomer, allowing it to relax. The second form of temporary deformation occurs when the combination of the factors of elastic modulus of the elastomer and magnitude of the electric field are below a threshold value. In that case, the surface deformation is erased either by removing or reversing the power supply for the electric field, or by flooding the photoconductive layer with light to erase the modulated electric field pattern.

The elastic modulus of the elastomer and the magnitude of the electric field also control the rapidity with which the deformation can be erased. Most imaging members are designed so that the elastomer springs back to its original position substantially immediately upon removal of the electric field, or upon flooding the photo-conductive layer with light. The rate of spring back is often described by an imaging member storage time, typically defined as the time for the intensity of a projected image to fall from maximum to one-half maximum.

The tendency of the imaging member to spring back substantially immediately is undesirable in many applications, such as xerography, in which a cyclic imaging member is often used as a buffer between a source of information generated at irregular time intervals and a means for recording information at regular time intervals. For instance, many cathode ray tube display devices operated by analog or digital computers provide information in varying time intervals. However, the devices used to optically record the information from the cathode ray tubes have fixed, regular cycle times. The effectiveness of the imaging member as a buffer depends upon its ability to response to varying rates of information input, and to retain the image long enough for the recording device to adequately capture the information. Most imaging members do not operate effectively as buffers, and this deficiency is not always corrected by using several imaging members in parallel, with one member acting as a storage buffer for previously encoded information, while the other is receiving date from the cathode ray tube.

SUMMARY OF THE INVENTION

It is the primary object of the invention to provide an apparatus for altering the deformation and storage time of an optical imaging member.

It is another object of the invention to provide such alterations automatically in response to parameters of the resultant read-out image from the imaging member.

It is a further object to provide high-speed alterations of deformation and storage time for optical imaging members which are used in character recognition, xerographic, or other systems requiring rapid cycle time.

It is yet a further object of the invention to provide apparatus for minimizing the loss of contrast and intensity of the resultant read-out image from the imaging member during the storage time.

The objects set forth above are achieved in a system which first measures the extent of deformation of a cyclic imaging member after an optical source has caused information to be encoded on a surface of the imaging member, and second, alters the extent of deformation of the surface in response to measurement of its later deformation. The system can be used not only to prolong deformation and, therefore, the storage time of the imaging member, but also to decrease the storage time or the amount by which the surface is deformed.

Because the system operates to measure the desired upper limit of deformation of the imaging member, it can be used to prevent permanent deformation of the elastomer, caused by operation with excessive voltages and deformation beyond the elastic limits of the member. The system also eliminates unnecessary extreme deformation and the resulting creation of higher order diffraction, extending the useful life of the elastomer because of less use of its elastic qualities, and decreasing the overall amount of power required to supply the electric field in the imaging member.

The increase in storage time of the cyclic imaging member allows it to be used in a greater number of applications. Because the information-generating devices, such as analog and digital computers, and the image recording devices, such as xerographic machines, are quite expensive to modify, the versatility added by the method and apparatus of the invention inexpensively provides efficient and adaptive cyclic imaging display and recording systems.

BRIEF DESCRIPTION OF THE DRAWINGS

An exemplary embodiment of the invention summarized above is illustrated in the accompanying drawings, in which.

Figure 1:
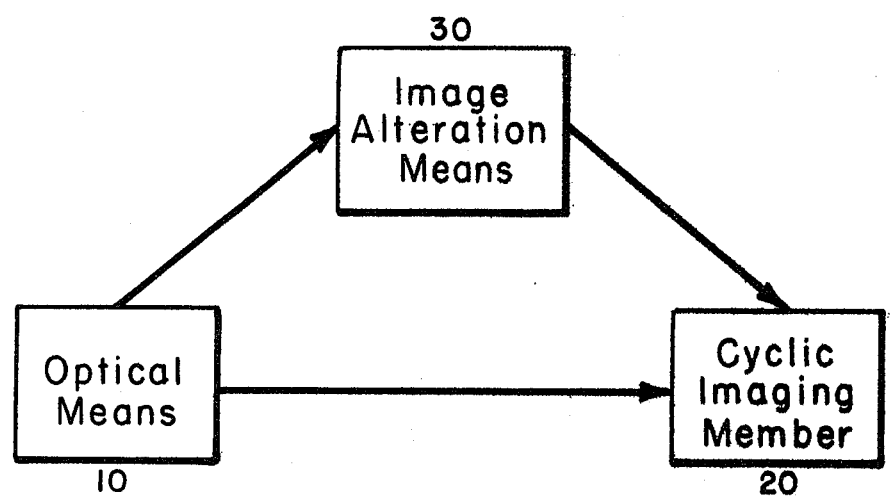
FIG. 1 is a block diagram of an exemplary embodiment of the system for altering the deformation of a cyclic imaging member.

A general knowledge of the operation of the system of the invention for altering the image storage time of a cyclic optical imaging member can be acquired by referring to FIG. 1 which shows a block 10, labeled optical means, interacting with a block 20, labeled cyclic imaging member. The optical means provides both a first light source to deform surfaces of the imaging member and a second light source, often called a reconstruction light source, to illuminate the surface so that the encoded information can be transferred to a recording device. Block 30, labeled image alteration means, represents the means for receiving information from the optical means and inputting a signal to the cyclic imaging member as a result.

Figure 4:
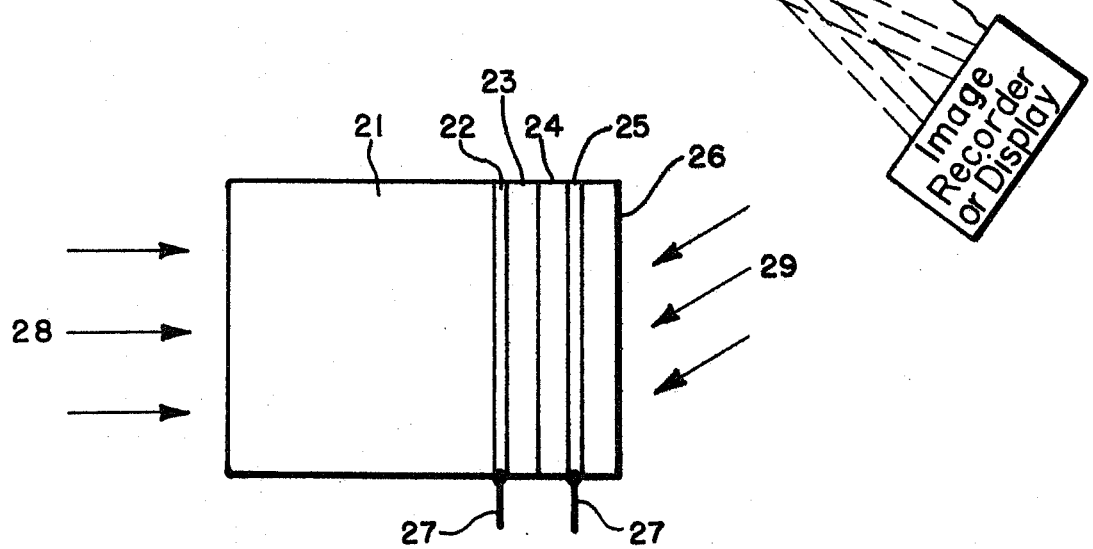
FIG. 4 is a side sectional view of an embodiment of a cyclic imaging member used in the present invention.

A cyclic imaging member is a laminated apparatus, one or more layers of which will deform upon illumination by a light source. FIG. 4 shows one common imaging member, such as that described in Sheridan U.S. Pat. No. 3,716,359. The imaging member of FIG. 4 includes a transparent substrate 21 which is either conductive, conductive on one surface thereof, or nonconductive. In the embodiment depicted, the substrate 21 is nonconductive. A layer 22 is conductive and transparent. A photo-conductive layer 23 is coated over conductive layer 22 and over the photo-conductive layer 23 is coated an elastomer layer 24. A conductive layer 25 and transparent insulating layer 26 which are placed over the elastomer must be thin enough to deform in conjunction with the elastomer. It is also desirable that the conductive layer 25 be made of a reflective material so that the reconstruction light can better transfer the information from the deformed surface to an image recording device. Conductive wires 27 lead to a controllable voltage source (not shown) which creates and/or alters the electric field maintained across conductive layers 22 and 25.

In operation, light 28 is incident upon the side of the imaging member on which substrate 21 is located. Because substrate 21 and conductive layer 22 are transparent, the light 28 reaches the photo-conductive layer 23. The electric field maintained across the photo-conductive layer 23 and elastomer 24 induces a flow of charge in those regions of the photoconductor 23 which are exposed to light, and the mechanical force of this induced electric field causes the elastomer 24 to deform to that modulated electic field. Conductive layer 25 and insulating layer 26 also deform in conjunction with the elastomer layer 24. Upon illumination by the reconstruction light 29, such deformations can be transferred to an image display or recording device. The degree of deformation and the storage time of the optical imaging member 20 are controlled by the intensity of the surface deformation light 28, the magnitude of the electric field 27, and the elastic properties of the material used in construction of the imaging member.

Figure 2:
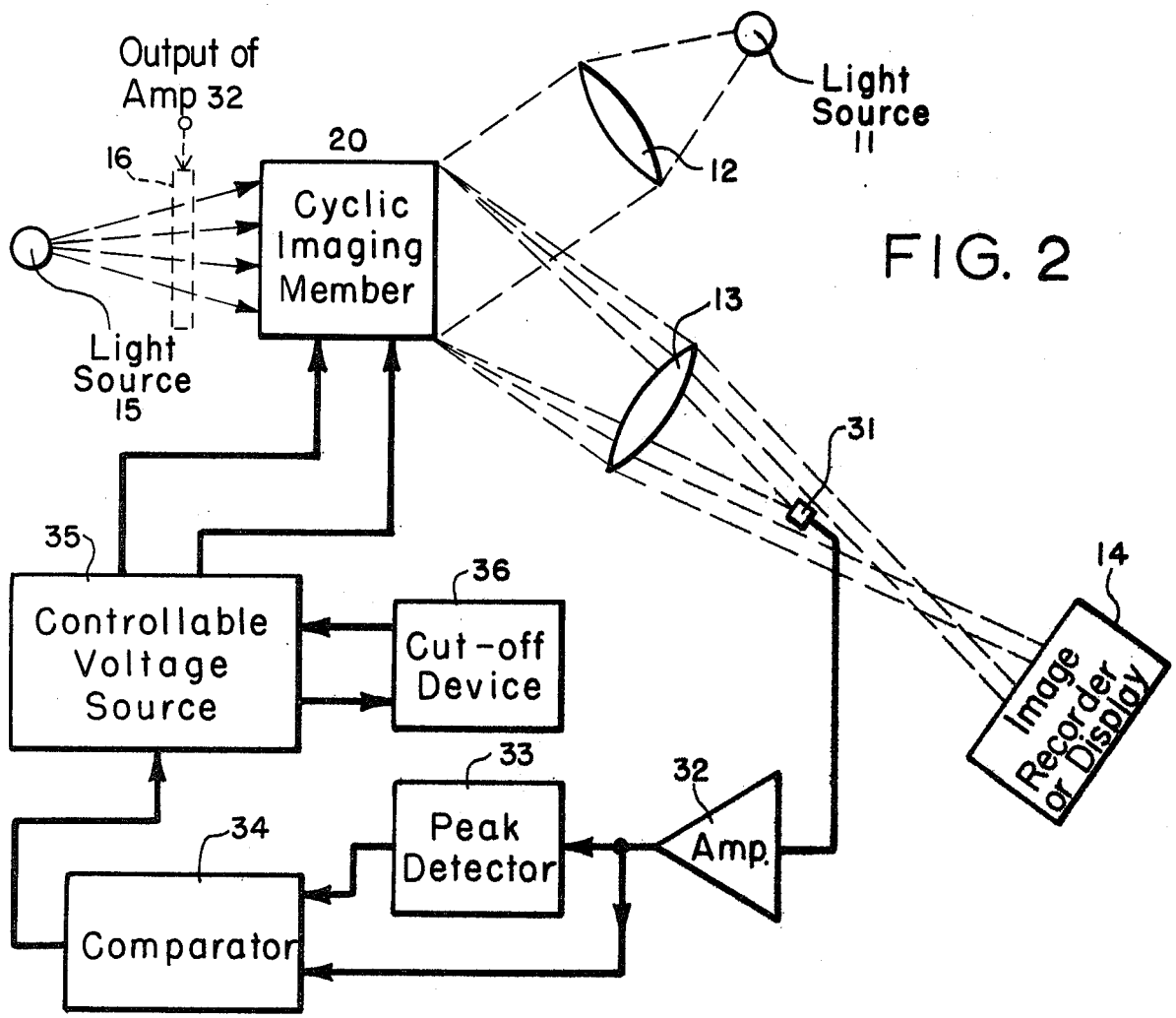
FIG. 2 is a schematic diagram of the system illustrated in block form in FIG. 1.

The first exemplary embodiment of the system for altering the deformation of the imaging member is shown in more detail by FIG. 2 which portrays the optical member 10 (FIG. 1) as including a reconstruction light source 11, lens 12, lens 13, image recording or display device 14, and light source 15. Light source 15 induces the deformation of a surface of the cyclic imaging member 20. Light provided by source 11 is directed to the surface of the cyclic imaging member by lens 12. The light is diffracted by the deformed surface of the imaging member and the diffracted light is then focused by lens 13 upon an image recording or display device 14 which records the image produced.

The image alteration means 30 (FIG. 1) includes a diffracted light detector 31 which is physically placed at the focal point for the zero-order light reflected from the surface of the cyclic imaging member 20 and focused by lens 13. Initially, before any light from source 15 is applied to the cyclic imaging member 20, all the light reflected from surface of the imaging member 20 will be of zero-order. Shortly after the exposure of the cyclic imaging member 20 to the light from source 15 the zero-order detector 31 signal will fall to a minimum as the reconstruction light from source 15 is diffracted into the non-zero orders. This signal minimum will correspond to maximum diffraction efficiency. Amplifier 32 inverts and amplifies the signal of the zero-order detector 31. The amplified signal is then conveyed to a peak detector 33 where the value is stored as a maximum.

As the deformation of the cyclic imaging member begins to erase, the signal of the zero-order detector 31 increases because the diffraction efficiency falls below the maximum and some light is returned to the undiffracted zero-order. The inverting amplifier 32 presents this signal increase to the comparator 34 as a value less than that originally stored by the peak detector 33. The comparator 34 recieves both the storage signal from the peak detector 33 and the present signal from the zero-order detector 31 and produces a proportional error signal which is input to the controllable voltage source 35. The voltage applied to the cyclic imaging member 20 is thereby increased to a higher value, inducing greater deformation of the surface, increased diffraction of the reconstruction light, and less light falling upon the zero-order detector 31.

The zero-order detector 31 signal continues to fall until its instantaneous value equals the previously stored maximum value in the peak detector 33. The zero-order detector 31 signal is continuously compared with the stored value from the peak detector 33 by the comparator 34, and an error signal inputted to the controllable voltage source 35 until a cut-off device 36 acts to cease control or to erase the surface deformation of the cyclic imaging member 20. In the exemplary embodiment the cut-off device 36 is activated when a predetermined elapsed time has expired from receipt of the initial signal from the comparator 34. Alternatively, the cut-off device 36 is energized when the voltage applied by the controllable voltage source 35 reaches a predetermined maximum value.

Figure 3:
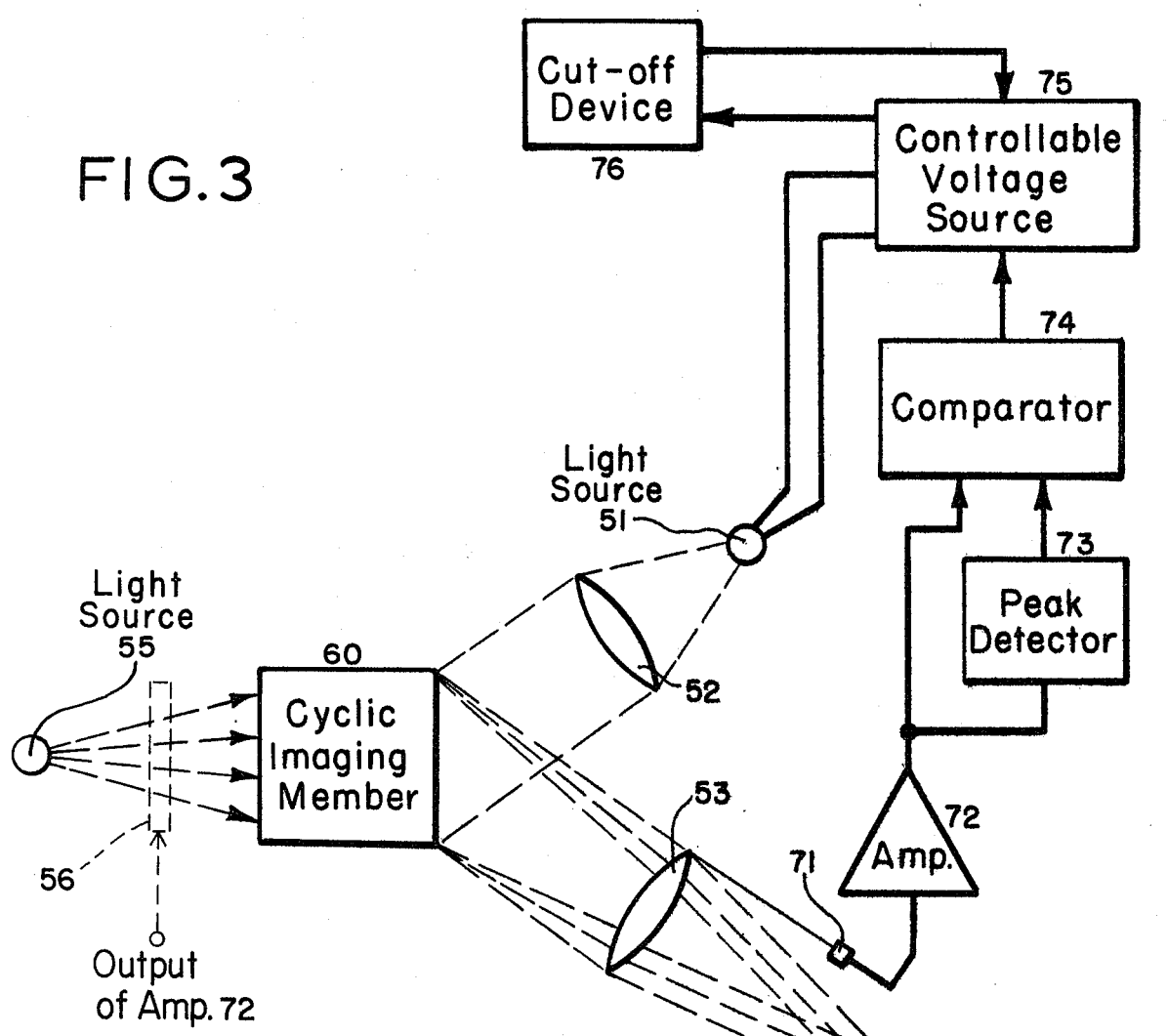
FIG. 3 is an alternative embodiment of the invention.

FIG. 3 portrays another exemplary embodiment of the invention, which adjusts the intensity of the reconstruction light rather than the degree of deformation of the cyclic imaging member. In FIG. 3, the light produced by source 55 is incident upon the cyclic imaging member 60 causing the elastomer deformation in the surface. Light is also directed from the source 51 by lens 52 to the deformed surface of the cyclic imaging member 60 and the diffracted light is then focused by lens 53 onto an image recording or display device 54. Shortly after the exposure of the cyclic imaging member 60 to the light source 55, the signal produced by the higher-order detector 71 reaches a maximum as the light from source 51 is diffracted into the non-zero higher-orders. Amplifier 72 amplifies this signal and peak detector 73 stores the value of the amplified signal as a maximum.

As the surface of the imaging member 60 begins to relax and erase the image, the diffraction efficiency falls below maximum and the intensity of the signal produced by the higher-order detector 71 decreases. This decreased signal is amplified by amplifier 72 and conveyed to comparator 75 where a proportional error signal is produced after comparison with the stored value from the peak detector 73. This error signal is inputted to the controllable voltage source 75 to increase the voltage applied to the reconstruction light source 51. The increased intensity of the light from source 51 causes more light to fall upon the higher-order detector 71, and the higher-order detector 71 signal increases until its instantaneous value equals the previously stored maximum value in the peak detector 73. The cutoff device 76 is activated when the voltage supplied by the controllable voltage source 75 reaches a predetermined maximum, or after a predetermined time has elapsed from the initial input of a comparison error signal to the controllable voltge source 75 within that cycle.

In view of the foregoing, it should be clear that several alternate combinations of the methods and systems of the above-described embodiments are possible. For instance, the detector used in FIG. 2 could be a higher-order detector which would require the amplifier 32 to be of the non-inverting type. Further, both the light source and cyclic imaging member voltages could be controlled. Or, in place of detector 31, a switch could be used which would be activated automatically after a suitable time delay. The system would thereby control at the signal level present when the switch was activated, rather than at the absolute peak diffraction efficiency. Because the diffraction efficiency is nearly constant for many seconds, the enable switch time-delay is not critical, and the use of such a switch may be adequate for many applications.

Additionally, with reference to FIG. 2, control of the photoconductor exposure by the light source 15 on the cyclic imaging member 20 could be achieved by using the output from the amplifier 32 to control a shutter 16 (shown in phantom) located between the cyclic imaging member and the light source 15. Thus the shutter closes, remains closed, and opens at predetermined output levels. The same explanation applies to the shutter 56 (shown in phantom in FIG. 3) which is responsive to the output level of the amplifier 72. This type of control is especially useful with a nonlinear cyclic imaging device or image recorder.

Of course, various other changes and modifications to the preferred embodiments described herein will be apparent to those skilled in the art. Such changes and modifications can be made without departing from the spirit and scope of the present invention and without diminishing its attendant advantages. It is, therefore, intended that such changes and modifications be covered by the following claims.

What is claimed is:

1. A system for altering the deformation of a cyclic imaging member comprising:
   deformable means, having a deformable surface arranged to be placed in an initial deformed position by the application of an input; and
   means, responsive to the extent of the deformation of the deformable surface, for altering the deformation of said surface.

2. The system as defined in claim 1 wherein the deformable surface has the characteristic of returning to its undeformed position substantially immediately upon removal of the input.

3. A system for altering the image storage time of a cyclic imaging system comprising:
   deformable means having a deformable surface arranged to be placed in an initial deformed position by the application of an input;
   means for applying electromagnetic radiation to said deformable means to produce an image corresponding to the deformation of the surface; and
   means, responsive to the extent of the deformation of the deformable surface, for altering the output of said electromagnetic radiation applying means.

4. The system as defined in claim 3 wherein the deformable surface has the characteristic of returning to its undeformed position substantially immediately upon removal of the input.

5. A system for altering the image storage time of a cyclic imaging system comprising:
   deformable means, having a surface deformable upon application of an input, said surface capable of returning to its undeformed position substantially immediately upon removal of said input;
   means for placing the deformable surface in an initial deformed position;
   means for applying electromagnetic radiation to said deformable means to produce an image corresponding to the deformation of the surface; and
   means, responsive to the image, for altering the deformation of the surface.

6. The system as defined in claim 5 wherein said means for altering the deformation of the surface maintains the deformable surface in the initial deformed position.

7. The system as defined in claim 5 wherein said means for altering the deformation of the surface comprises:
   means for detecting a characteristic of the image at first and second times after the deforming input has placed the deformable surface in the initial deformed position;
   means for comparing the characteristics detected at the first and second times, and producing an output corresponding to the difference between the characteristics; and
   means for applying the output to said deformable means to alter the deformation of the deformable surface.

8. The system as defined in claim 7 wherein the first time of detection occurs while the deformable surface is in its initial deformed state.

9. The system as defined in claim 7 wherein the electromagnetic radiation is visible light and the characteristic is the intensity of the visible light.

10. The system as defined in claim 9 wherein said detecting means produces an electric signal in response to the intensity of the visible light, and said comparing and output-producing means compares the electric signals produced at the first and second times to produce an output signal.

11. The system as defined in claim 10 further comprising means for preventing the application of said input to said deformable means during the period said electric signal exceeds a predetermined value.

12. The system as described in claim 9 wherein said means for detecting the intensity of the visible light is so positioned as to respond to zero-order diffractions.

13. A system for altering the image storage time of a cyclic imaging system comprising:
   deformable means, having a surface deformable upon application of an input, said surface capable of returning to its undeformed position substantially immediately upon removal of a deforming input;
   means for applying electromagnetic radiation to said deformable means to produce an image corresponding to the deformation of the surface; and
   means, responsive to the image, for altering the output of said electromagnetic radiation application means.

14. The system as defined in claim 13 wherein said means for altering the output of said electromagnetic radiation application means increases the output of said radiation means.

15. The system as defined in claim 13 wherein said means for altering the output of said electromagnetic radiation application means comprises:
   means for detecting a characteristic of the image at first and second times after the deforming input has placed the deformable surface in the initial deformed position;
   means for comparing the characteristics detected at the first and second times to produce an output corresponding to the difference between the characteristics; and
   means for applying the output to said electromagnetic radiation application means to alter the output of said radiation means.

16. The system as defined in claim 15 wherein the first time of detection occurs while the deformable surface is in its initial deformed state.

17. The system as defined in claim 15 wherein the electromagnetic radiation is visible light and the characteristic is the intensity of the visible light.

18. The system as defined in claim 17 wherein said detecting means produces an electric signal in response to the intensity of the visible light, and said comparing and output-producing means compares the electric signals produced at the first and second times to produce an output signal.

19. The system as defined in claim 18 further comprising means for preventing the application of said input to said deformable means during the period said electric signal exceeds a predetermined value.

20. The system as defined in claim 15 wherein said means for detecting the intensity of the visible light is so positioned as to respond to diffractions of an order greater than zero.

21. A method of altering the deformation of a cyclic imaging member comprising:
   deforming a surface of the cyclic imaging member to an initial deformed position; and
   altering the deformation of the surface in response to a parameter of a later deformed position of the surface.

22. The method as defined in claim 21 wherein said step of altering the deformation of the surface comprises:
   applying electromagnetic radiation to the surface to produce an image corresponding to the deformation of the surface;
   detecting a characteristic of the image at first and second times after said step of deforming the surface; and
   altering the deformation of the deformable surface in response to the characteristics detected at the first and second times.

23. The method as defined in claim 22 wherein the first time of detection occurs while the deformable surface is in its initial deformed state.

24. The method as defined in claim 22 wherein the electromagnetic radiation is visible light and the characteristic is the intensity of visible light.

25. A method of altering the image storage time of a cyclic imaging system comprising:
   deforming a surface of a cyclic imaging member to an initial deformed position;
   applying visible light to the surface to produce an image corresponding to the deformation of the surface;
   producing an electric signal corresponding to the intensity of the image at first and second times, the first time occurring while the deformable surface is in its initial deformed state and the second time occurring subsequently thereto;
   comparing the electric signals at the first and second times;
   producing an output signal as a result of said step of comparing; and
   applying the output signal to the cyclic imaging member.

26. The method as defined in claim 25 wherein the electric signal produced corresponds to the intensity of the image at a zero-order of diffraction.

27. A method of altering the image storage time of a cyclic imaging system comprising:
   deforming a surface of a cyclic imaging member to an initial deformed position;
   applying electromagnetic radiation to the surface to produce an image corresponding to the deformation of the surface; and
   altering the intensity of the electromagnetic radiation in response to a parameter of a later deformed position of the surface.

28. The method as defined in claim 27 wherein said step of altering the intensity of the electromagnetic radiation includes detecting a characteristic of the image first and second times after said step of deforming the surface.

29. The method as defined in claim 28 wherein the first time of detection occurs while the deformable surface is in its initial deformed state.

30. The method as defined in claim 28 wherein the electromagnetic radiation is visible light and the characteristic is the intensity of the visible light.

31. A method of altering the image storage time of a cyclic imaging system comprising:
   deforming a surface of a cyclic imaging member to an initial deformed position;
   applying visible light to the surface to produce an image corresponding to the deformation of the surface;

producing an electric signal corresponding to the intensity of the image at first and second times, the first time occurring while the deformable surface is in its initial deformed state;

comparing the electric signals at the first and second times;

producing an output signal as a result of said step of comparing; and applying the output signal to alter the intensity of the visible light in said light applying step.

32. The method as defined in claim 31 wherein the electric signal produced corresponds to the intensity of the image at an order of diffraction greater than zero.

* * * * *